(12) United States Patent
Han et al.

(10) Patent No.: US 7,772,676 B2
(45) Date of Patent: Aug. 10, 2010

(54) STRAINED SEMICONDUCTOR DEVICE AND METHOD OF MAKING SAME

(75) Inventors: Jin-Ping Han, Fishkill, NY (US); Hung Y. Ng, New Milford, NJ (US); Judson R. Holt, Poughkeepsie, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 646 days.

(21) Appl. No.: 11/473,883

(22) Filed: Jun. 23, 2006

(65) Prior Publication Data

US 2007/0295989 A1 Dec. 27, 2007

(51) Int. Cl.
*H01L 29/78* (2006.01)
*H01L 21/336* (2006.01)

(52) U.S. Cl. ............................. 257/616; 257/E21.619; 438/300

(58) Field of Classification Search .................. 257/613, 257/616, 213, 288, 368, 382, 384, E21.616, 257/E21.619; 438/142, 197, 299, 300
See application file for complete search history.

(56) References Cited

U.S. PATENT DOCUMENTS

| | | | |
|---|---|---|---|
| 4,855,017 A * | 8/1989 | Douglas | 438/695 |
| 6,030,874 A * | 2/2000 | Grider et al. | 438/301 |
| 6,218,711 B1 * | 4/2001 | Yu | 257/384 |
| 6,228,166 B1 * | 5/2001 | Suzuki et al. | 117/94 |
| 6,277,657 B1 * | 8/2001 | Nozawa et al. | 438/8 |
| 6,885,084 B2 | 4/2005 | Murthy et al. | |
| 7,019,380 B2 | 3/2006 | Sanuki | |
| 7,026,693 B2 | 4/2006 | Shimizu et al. | |
| 2003/0111690 A1 * | 6/2003 | Adachi | 257/344 |
| 2004/0125629 A1 * | 7/2004 | Scheuerlein et al. | 365/17 |
| 2004/0159873 A1 * | 8/2004 | Goldbach et al. | 257/301 |
| 2005/0142768 A1 * | 6/2005 | Lindert et al. | 438/285 |
| 2006/0043529 A1 | 3/2006 | Chidambarrao et al. | |
| 2006/0166492 A1 * | 7/2006 | Orlowski et al. | 438/637 |
| 2007/0235802 A1 * | 10/2007 | Chong et al. | 257/346 |

* cited by examiner

*Primary Examiner*—Sue Purvis
*Assistant Examiner*—Kevin Quinto
(74) *Attorney, Agent, or Firm*—Slater & Matsil, L.L.P.

(57) ABSTRACT

A semiconductor body is formed from a first semiconductor material, e.g., silicon. A compound semiconductor region, e.g., silicon germanium, is embedded in the semiconductor body. The compound semiconductor region includes the first semiconductor material and a second semiconductor material. The compound semiconductor region has a concentration of the second semiconductor material that varies along an interface between the side portion of the compound semiconductor region and the side portion of the semiconductor body

17 Claims, 9 Drawing Sheets

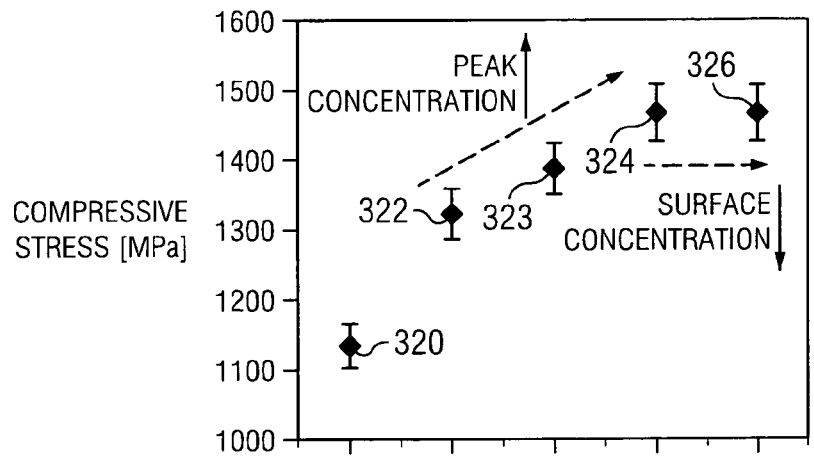
*FIG. 4*
*FIG. 5a*
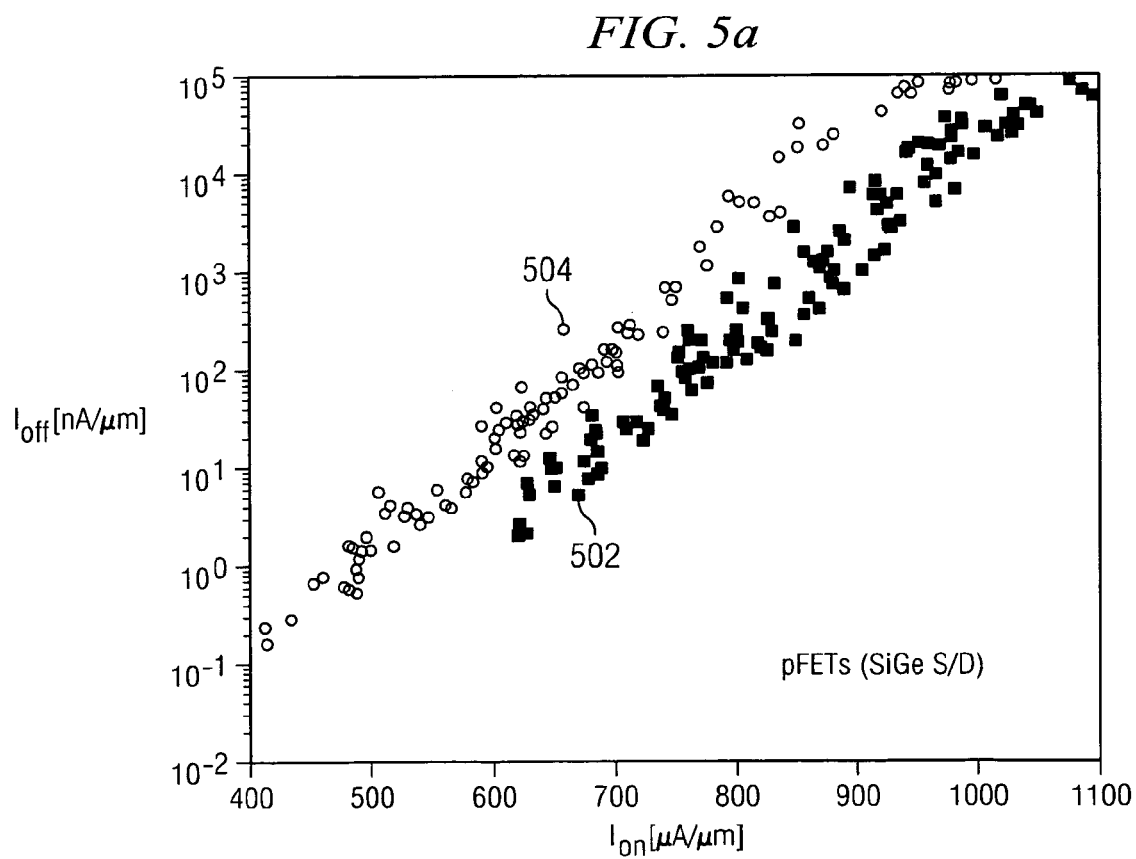

STRAINED SEMICONDUCTOR DEVICE AND METHOD OF MAKING SAME

The invention claimed herein was made subject to and as a result of a joint research agreement between Infineon Technologies AG, Chartered Semiconductor Manufacturing Ltd., and International Business Machines Corporation.

TECHNICAL FIELD

This invention relates generally to semiconductor devices and methods, and more particularly to a strained semiconductor device and a method of making the same.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. In addition, higher conductivity materials, such as copper, are replacing lower conductivity materials, such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility improvement and performance boost of devices. For example, stress can be provided by a contact etch stop layer (CESL), single layers, dual layers, stress memory transfer layers, STI liners, and CA liners. Most of these techniques use nitride layers to provide tensile and compressive stresses; however, other materials can be used in other applications, e.g., HDP oxide layers.

Another method for inducing strain, known as embedded SiGe (eSiGe), involves creating a recess in the source and drain regions of a MOS transistor and growing a doped SiGe film within the recess in lieu of a conventional silicon source and drain region. The larger germanium crystal lattice creates a stress in the channel between the source and drain and thereby enhances the carrier mobility. Typically, the higher the Ge concentration in the SiGe film grown within the recesses, the higher the carrier mobility that can be achieved.

In the field of small, densely packed applications using small geometry CMOS transistors, however, the use of eSiGe to enhance carrier mobility becomes challenging because as the geometries of the semiconductor process get smaller, higher stress is required in the channel in order to maintain adequate performance. While increasing the concentration of Ge in the SiGe film is desirable to achieve this goal, manufacturing a high yield SiGe film with a higher and higher Ge concentration becomes progressively more difficult.

SUMMARY OF THE INVENTION

In one embodiment, a semiconductor body comprising a first semiconductor material is provided. A compound semiconductor region is embedded in the semiconductor body so that a side portion of the compound semiconductor region is abuts a side portion of the semiconductor body. The compound semiconductor region comprises a compound semiconductor including the first semiconductor material and a second semiconductor material. The concentration of the second semiconductor material varies along an interface between the side portion of the compound semiconductor region and the side portion of the semiconductor body.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is a graph depicting stress with respect to process variation;

FIGS. 5a-5b are graphs showing transistor off current versus on current over various process variations;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for improving carrier mobility in a CMOS device. Concepts of the invention can also be applied, however, to other electronic devices. As but one example, bipolar transistors (or BiCMOS) can utilize concepts of the present invention.

Figure 1:
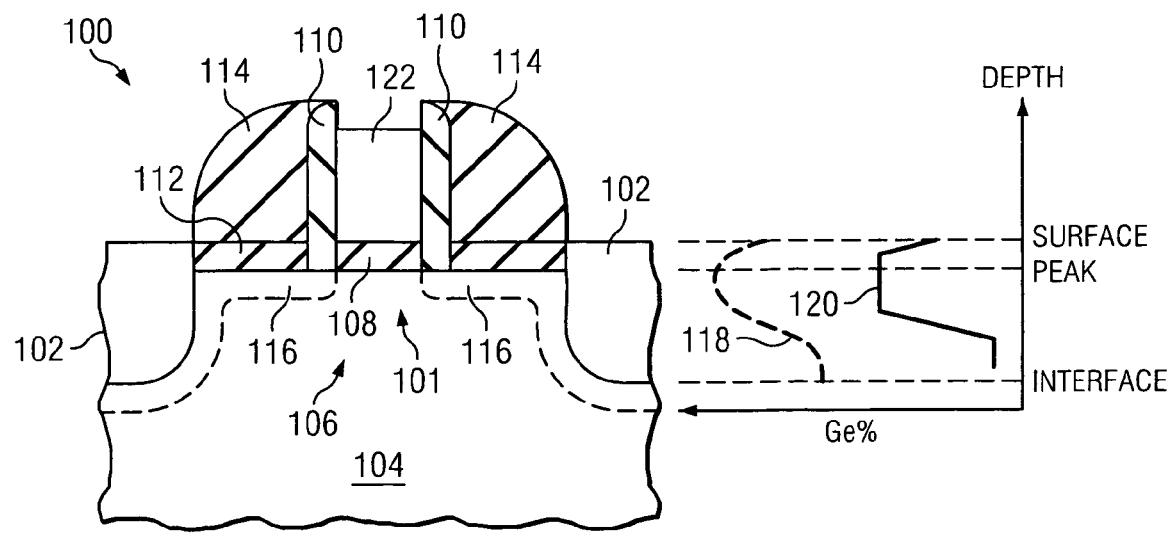
FIG. 1 contains a cross-sectional view and a Ge concentration graph of a preferred embodiment.

With reference now to FIG. 1, a cross-sectional view of a preferred embodiment of the present invention, a semiconductor device 100 is shown. A gate dielectric 108, a gate electrode 122, and first spacers 110 are formed over a semiconductor body 104. A dielectric layer 112, e.g. a low temperature oxide (LTO), is formed over the extension areas, over which nitride spacers 114 are formed. The first and second spacers 110 and 114 can be formed of oxide and nitride, respectively. In the figure, the source/drain regions are illustrated by dashed line 116. In the preferred embodiment of the present invention, source/drain regions 116 include embedded SiGe (eSiGe) source/drain regions 102 that are formed to provide stress to the channel 101 in the active area 106. As shown by the dashed line, source/drain regions 116 further include lightly doped diffusion areas (LDD), which can minimize hot carrier effects by lowering the electric field in the vicinity of the drain.

Experimental results have shown that the higher the concentration of Ge within the eSiGe source/drain regions 102, the more stress that is imparted to the channel 101. Unfortunately, high-yielding SiGe films with uniform Ge concentrations greater than 20% are difficult to manufacture. In a preferred embodiment of the present invention, however, the Ge concentration within the eSiGe source/drain regions 102 is graded so that the Ge concentration within the eSiGe source/drain regions 102 reaches its peak Ge concentration in the region adjacent to the channel 101 in the active area 106.

The graphs in FIG. 1 adjacent to the cross-sectional view of the transistor illustrate, for one embodiment, the relative Ge concentration within the eSiGe source/drain regions 102 as a function of depth in curve 118, and illustrate the relative amount of Ge imparted to the eSiGe source/drain regions 102 as a function of depth during fabrication in curve 120. Further experimental results, as will be discussed below, have shown that a graded eSiGe source/drain region imparts a greater amount of stress to the channel for a given peak Ge concentration than a eSiGe source/drain region with a uniform Ge concentration.

FIGS. 2a-2f provide cross-sectional views that illustrate a preferred embodiment for forming a semiconductor device 200 of the present invention. While certain details may be explained with respect to only one of the embodiments, it is understood that these details can also apply to other ones of the embodiments.

Figure 2A:
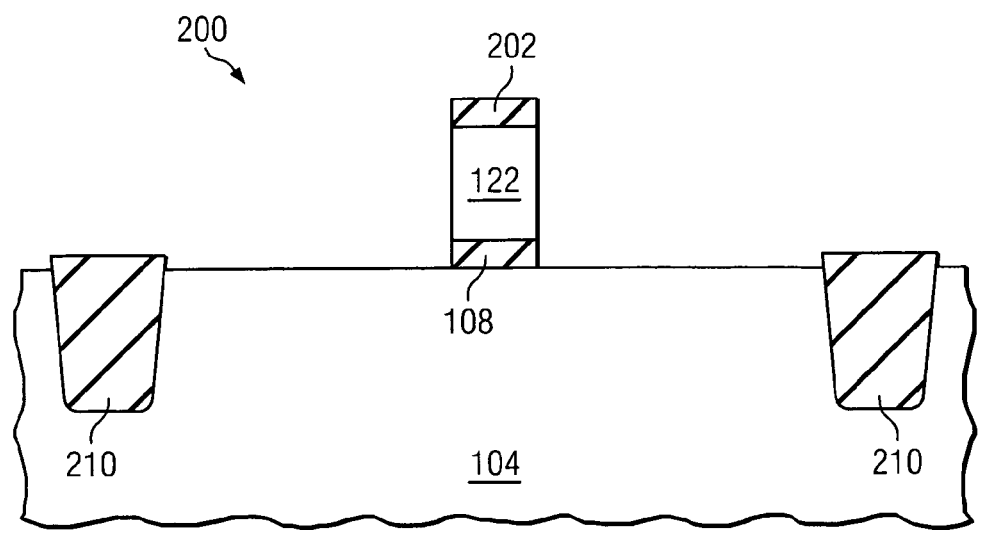
FIGS. 2a-2f provide cross sectional views of a preferred embodiment process.

Referring first to FIG. 2a, a semiconductor body 104 is provided. In the preferred embodiment, the semiconductor body 104 is a silicon wafer. For example, the body 104 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer. With these other materials, the shown source/drain regions (see FIG. 2d) would be other materials.

In the first embodiment, STI regions 210 are formed in the semiconductor body 104. First, isolation trenches can be formed using conventional techniques. For example, a hard mask layer (not shown here), such as silicon nitride, can be formed over the semiconductor body 104 and patterned to expose the isolation areas. The exposed portions of the semiconductor body 104 can then be etched to the appropriate depth.

The trenches are then filled with an isolating material. For example, exposed silicon surfaces can be thermally oxidized to form a thin oxide layer. The trenches can then be lined with a first material such as a nitride layer (e.g., $Si_3N_4$). The trenches can then be filled with a second material, such as an oxide. For example, a high plasma density (HDP) can be performed, with the resulting fill material being referred to as HDP oxide. In other embodiments, other trench filling processes can be used.

As also shown in FIG. 2a, a gate stack is formed. A gate dielectric 108 is deposited over exposed portions of the semiconductor body 104. In one embodiment, the gate dielectric 108 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 108. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 108 can comprise other high-k insulating materials or other dielectric materials. As implied above, the gate dielectric 108 may comprise a single layer of material, or alternatively, the gate dielectric 108 may comprise two or more layers.

The gate dielectric 108 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 108 may be deposited using other suitable deposition techniques. The gate dielectric 108 preferably comprises a thickness of about 10 Å to about 60 Å in one embodiment, although alternatively, the gate dielectric 108 may comprise other dimensions.

In the illustrated embodiment, the same dielectric layer would be used to form the gate dielectric 108 for both the p-channel and n-channel transistors. This feature is not required, however. In alternate embodiments, the p-channel transistor and the n-channel transistor could each have different gate dielectrics.

The gate electrode 122 is formed over the gate dielectric 108. The gate electrode 122 preferably comprises a semiconductor material, such as polysilicon or amorphous silicon, although alternatively, other semiconductor materials may be used for the gate electrode 122. In other embodiments, the gate electrode 122 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 122 comprises a doped polysilicon layer underlying a silicide layer (e.g., titanium silicide, nickel silicide, tantalum silicide, cobalt silicide, or platinum silicide).

A nitride layer 202 is formed over the gate electrode 122. This layer 202 can be used as a hard mask during the etching of gate electrode 122. The nitride will also prevent embedded SiGe material from forming on the gate electrode 122 during the later step of forming the SiGe source/drain stress-inducing regions (see FIG. 2a). The nitride layer 202 is formed using conventional techniques. In other embodiments, the layer 202 can be formed from a material other than nitride.

The gate layer (and optionally the gate dielectric layer) are patterned and etched using known photolithography techniques to create the gate electrode 122 of the proper pattern. In a preferred embodiment of the present invention, the gate layer will be etched to achieve a gate length of less than 60 nm, for example, 45 nm. After formation of the gate electrodes 122, lightly doped source/drain regions (not shown) can be implanted using the gate electrode 122 as a mask. Other implants (e.g., pocket implants, halo implants or double-diffused regions) can also be performed as desired.

Figure 2B:
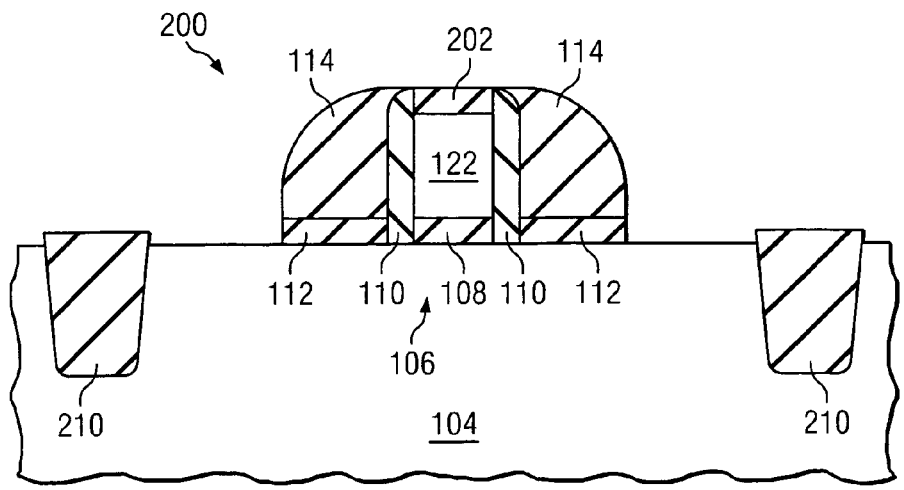

As shown in FIG. 2b, first spacers 110, which are formed from an insulating material such as an oxide and/or a nitride, can be formed on the sidewalls of the gate electrode 122. In the illustrated embodiment, first spacers 110 are formed by the deposition of a conformal layer followed by an anisotropic etch. Second spacers 114 are formed adjacent to the first spacers using conventional techniques. In a preferred embodiment, the first spacers 110 are formed from an oxide (e.g., a low temperature oxide) and the second spacers 114 are formed from a nitride. While illustrated with two spacers, the invention also contemplates structures with a single spacer, more than two spacers, or no spacers at all.

In the embodiment of FIG. 2b, the second spacers 114 are separated from the active area 106 by a layer 112. The layer 112 can be apart of the gate oxide. More preferably, a low temperature oxide layer 112 is formed before the deposition of the nitride spacer 114. The layer 112 will protect the active area 106 from the second spacer 114. These regions will also protect the extension regions (not shown) during source/drain formation.

Figure 2C:
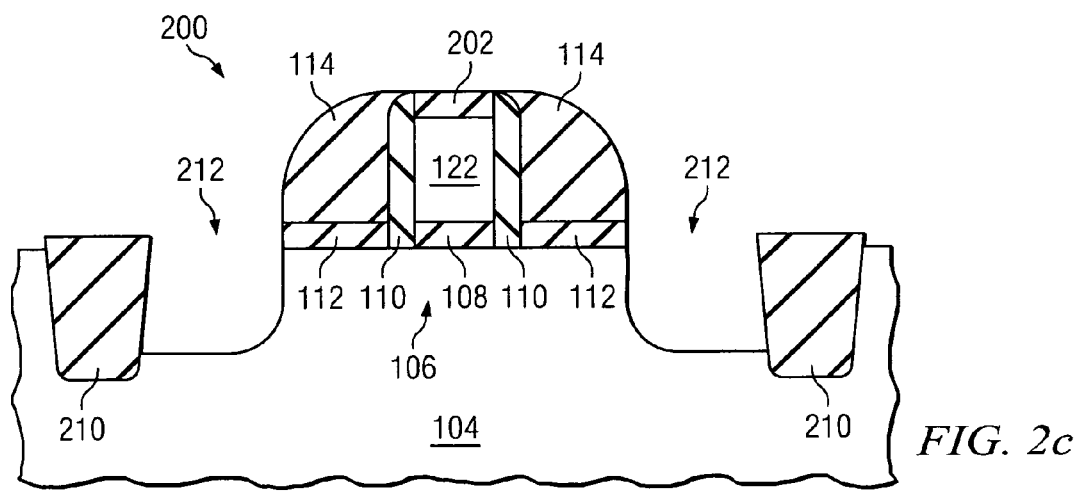

Turning now to FIG. 2c, recesses 212 are formed in the source/drain areas of the transistor 200. Photoresist (not shown) is used to expose the silicon body 104 and the recesses 212 are formed by selective ion dry cutting or Isotropic RIE. Alternatively, other forms of recess formation can be used such as wet or in-situ HCL etch or combinations thereof. The recesses extend to a depth of between 10 nm and 200 nm. In the preferred embodiment, 80 nm. The absolute depth, however, is a function of the process used.

In the preferred embodiment, a CMOS structure is formed. Since the strain is only desired for the p-channel transistors, resist (not shown) would fully cover any p-wells (where the n-channel transistors are formed). In the illustrated embodiment, the recesses 212 extend from the gate stack (e.g. spacer 114) to the STI region 210, but this feature is not needed. While it is desirable that the recesses 212 extend as close to channel 101 as possible, it is not necessary that the region extend to the STI 210.

Figure 2D:
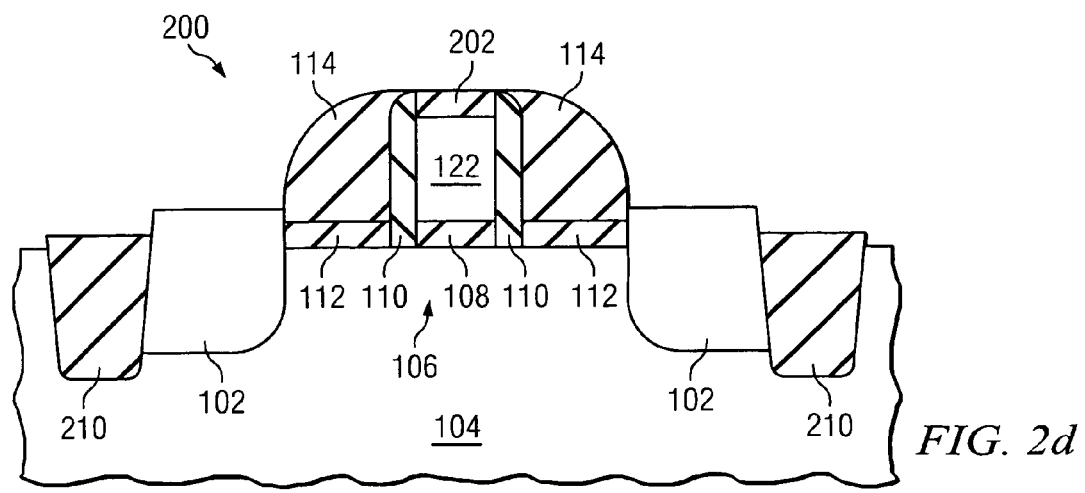

In FIG. 2d, the recesses are filled with embedded SiGe to form the graded eSiGe source/drain regions 102 using a selective epitaxial growth (SEG) technique. One goal of providing an eSiGe source/drain region is to provide stress to the channel. As such, the Ge concentration should be the greatest adjacent to the channel, but the upper and lower portions of the eSiGe regions preferably contain a lower Ge concentration. If the concentration is too high in the lower portions of the eSiGe source/drain regions, the device would be more prone to manufacturing and fabrication defects at the SiGe 102/Si 104 interface. On the other hand, if the concentration were too high on the upper end of the eSiGe source/drain regions, difficulties with siliciding the source/drain regions can result since silicidation does not yield well when applied to areas of high Ge concentration.

The present invention can be fabricated using any of a number of processes. As just one example, the recess 212 is filled by exposing the semiconductor body 104 to $SiH_2Cl_2$ (dichlorosilane (DCS)) or $SiH_4$ (silane), HCl, $B_2H_6$, and $GeH_4$ (germane) gases under the following conditions:

| Parameter | Initial Period | Peak Period | Final Period |
|---|---|---|---|
| Temp | 500° C.-800° C. | 500° C.-800° C. | 500° C.-800° C. |
| Pressure | 5-50 torr | 5-50 torr | 5-50 torr |
| $GeH_4$ Flow Rate | 0-50 sccm | 50-100 sccm | 0-50 sccm |
| $B_2H_6$ Flow Rate | 0-100 sccm | 0-100 sccm | 0-100 sccm |
| DCS or $SiH_4$ Flow Rate | 50-300 sccm | 50-300 sccm | 50-300 sccm |
| HCl Flow Rate | 0-200 sccm | 0-200 sccm | 0-200 sccm |

The $SiH_4$ (silane) or $SiH_2Cl_2$ (DCS) gas serves as the silicon source gas and the $GeH_4$ (germane) serves as the Ge source gas in the deposition of the embedded SiGe film 102. The $B_2H_6$ serves as a p-type dopant source; i.e., a source for boron dopants. In other embodiments, other gases may be used. If the source/drain regions are subsequently doped, e.g., by implantation, the dopant source gas can be eliminated. Furthermore, in other embodiments where the embedded compound semiconductor is a material other than SiGe (e.g. SiC) other gases may be used also. If the source/drain is not doped in situ, a subsequent implantation step can be performed.

In the preferred embodiment of the present invention, the eSiGe source/drain areas 102 are characterized by a graded profile, hence, the germane gas flow rate is variable and depth dependent. The initial $GeH_4$ gas flow rate is defined in the chart above under the heading "Initial Period" and is ramped up over time to a level defined under the heading "Peak Period." The peak flow rate is held for a duration defined in the table, and then is ramped down to a level defined under the heading "Final Period." These periods correspond to the right-most graph in FIG. 1. In other embodiments, the Si precursor gas flow rate can be varied, either in addition to or instead of varying the germane gas flow.

In other embodiments of the present invention, this target Ge concentration may be higher or may be lower at the top of the eSiGe source/drain region. The eSiGe source/drain region 102 is grown to a height such that the edges and top of the layer 112 are completely covered by either the second spacer 114, or the eSiGe source/drain region 102.

After the eSiGe source/drain regions are formed, an optional anneal step may be performed to activate the dopants in the source/drain regions. In this step, the semiconductor body 104 is heated to between 900° C. and 1400° C.

Experimentation using one particular process provides a peak Ge concentration of about 26%. In other embodiments, the peak Ge concentration can range from 24% to 36%. For example, if the germane flow rate is increased above 60 sccm, the peak concentration can exceed 30%. In other embodiments, other concentrations can be achieved.

Figure 2E:
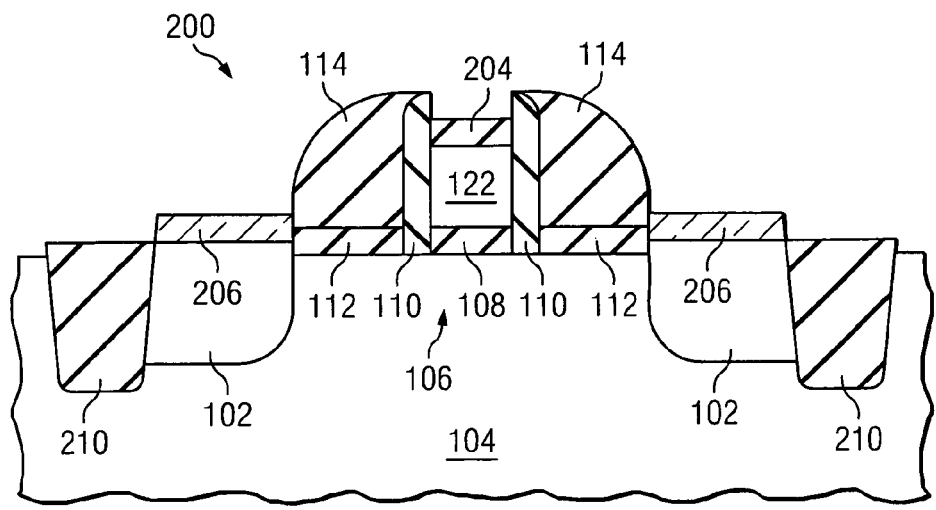

As shown in FIG. 2e, the layer 202 is removed from over the gate 122. For example, a nitride 202 can be removed by hot phosphoric acid etch, RIE or dry chemical etch. Silicide regions 206 are then formed over the eSiGe source/drain regions 102, and silicide region 204 is formed over the gate electrode 122 to form low resistivity upper surface regions. Silicide is formed by first depositing a silicidation metal over the source and drain regions 102 and over the gate electrode 122, then subjecting the structure to an annealing process. In the preferred embodiment, the silicidation metal is nickel, but the metal could also be cobalt, copper, molybdenum, titanium, tantalum, tungsten, erbium, zirconium, platinum, or combinations thereof. In one example, the semiconductor body 104 is then heated to about 600° C. or 700° C. to form a single layer of nickel silicide.

Figure 2F:
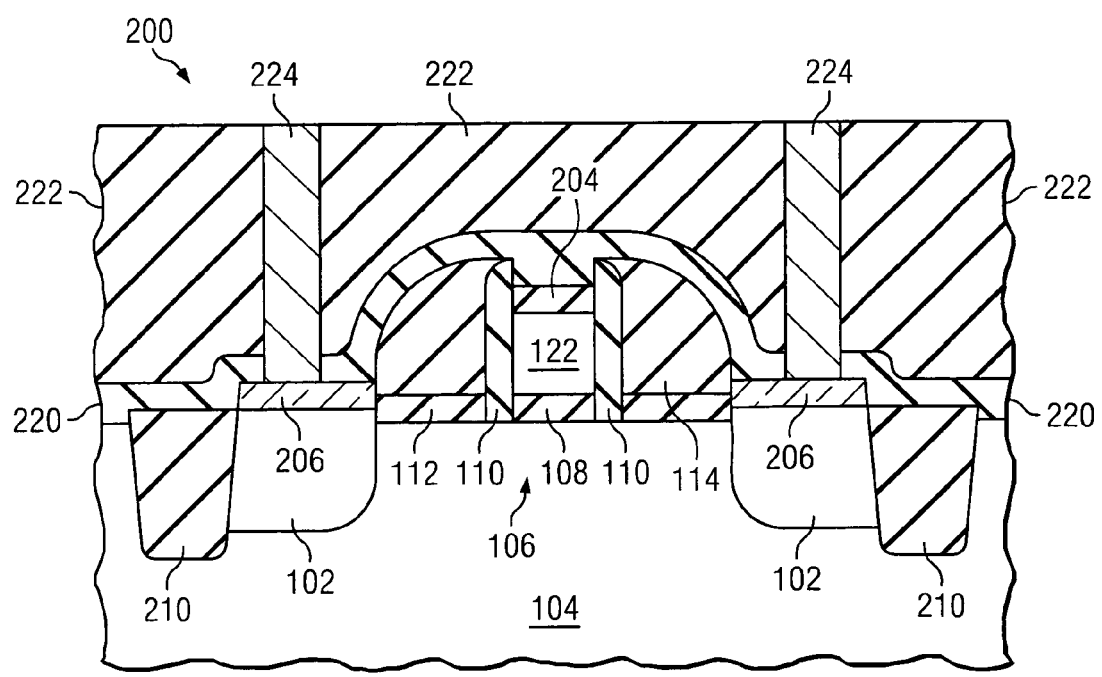

Referring now to FIG. 2f, a contact etch stop layer 220 (CESL) is formed over the surface of the device 200. In a preferred embodiment of the present invention, a nitride film (e.g., silicon nitride) is deposited, but other materials can be deposited. An interlayer dielectric (ILD) layer 222 is then formed over the CESL 220. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples.

In regions where contact holes are made, the ILD 222 is etched down to the CESL 220. Using a contact mask, photoresist (not shown) is deposited to mask off the non-exposed regions to the etch process. The ILD 222 is then etched down to the CESL 220 using standard etch techniques. In this step, the ILD 222 etches away at a faster rate than the CESL 220. Once the etch is complete, the photoresist may be removed. A second etch is then performed. This time, the CESL 220 is etched to expose the silicided source/drain regions 206 using the ILD 222 as a mask using standard etch techniques.

Source/drain contacts 224 are formed through the interlayer dielectric by depositing conductive material on the exposed portions of the silicided source/drain regions 206. Any standard contact fabrication technique may be used. Typically, a liner, such as TiN, is deposited to form an ohmic contact, after which tungsten is deposited using CVD techniques. Metallization layers that interconnect the various components are also included in the chip, but not illustrated for the purpose of simplicity.

Figure 3A:
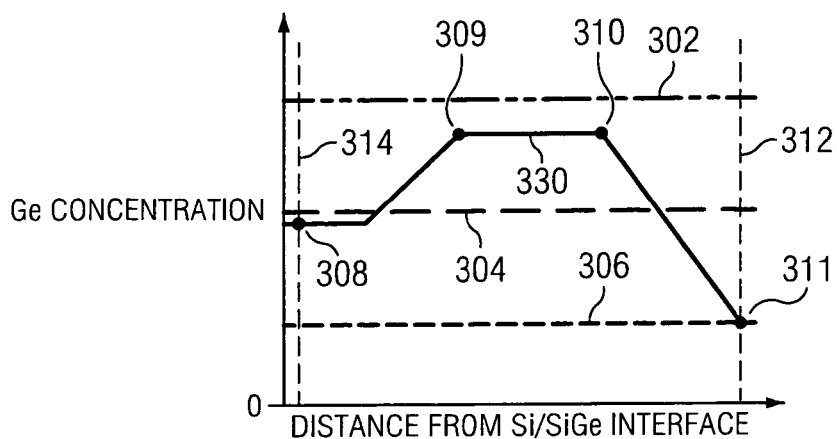
FIGS. 3a-3c are graphs depicting Ge concentration with respect to distance from Si/SiGe interface.
Figure 3B:
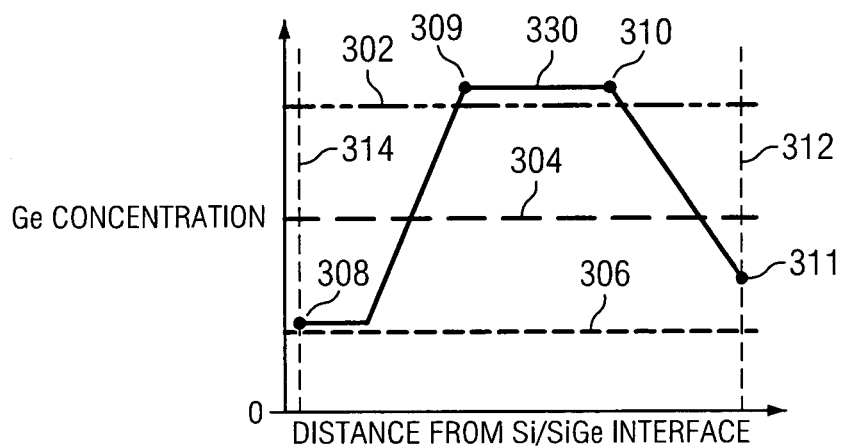
Figure 3C:
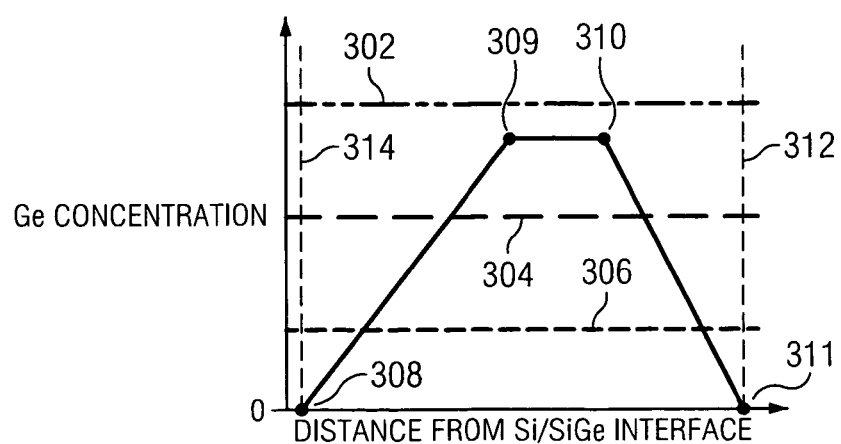

FIG. 3a shows a graph depicting the relative Ge concentration as a function of the distance from the Si/SiGe interface in a preferred embodiment of the present invention. Line 314 signifies the position of the Si/SiGe interface and line 312 signifies the position of the SiGe top surface. Line 302 represents a high Ge concentration, line 304 represents a medium SiGe concentration, and line 306 represents a low SiGe concentration. Line 330 represents the relative Ge concentration level. As is shown by the graph, the Ge concentration is between low 306 and medium 304 near the Si/SiGe interface at point 308, increases to a peak Ge concentration between high 302 and medium 304 at point 309, is held at the peak concentration until point 310, and then decreases to a low 306 concentration at point 311 which is at the top surface of the SiGe film. Other embodiments of the present invention, however, may have different Ge concentrations as a function of distance. For example, FIG. 3b shows an the Ge concentration profile of an alternate embodiment, where the initial concentration at point 308 is at a low 306 concentration and ramps up to a high 302 concentration at point 309. Another alternate embodiment is shown in FIG. 3c, which shows a Ge concentration profile with a different ramping characteristic. Other embodiments with different Ge concentration profiles not shown herein can also be fabricated.

FIG. 4 shows a graph depicting channel stress as a function of various Ge process parameters. The y-axis signifies channel stress as measured by using X-ray diffraction residual stress analysis (XRD), and the x-axis signifies different process runs in which the Ge peak concentration and Ge surface concentration are varied. Point 320 represents a process with a constant Ge concentration. The peak Ge concentration of process 324 is substantially the same as the peak Ge concentration of process 324, but is greater than the peak Ge concentration of process 323. The peak Ge concentration of process 323 is, in turn, greater than the peak Ge concentration of process 322. The graph in FIG. 4 thus shows that the amount of compressive stress in the channel increases with increased peak Ge concentration in an eSiGe film with a graded Ge concentration. The graph also shows that the graded eSiGe films produce more stress than ungraded eSiGe films. Other embodiments of the present invention, however, may produce channel stress magnitudes different from the specific embodiment described herein.

In FIG. 4, process points 324 and 326 contain the same peak Ge concentration in the eSiGe film, but the surface Ge concentration in process 324 is greater than the surface Ge concentration in process 326. As shown by the graph, however, the channel stress yielded by process 324 is similar to the channel stress yielded by process 326. As such, it appears that the stress produced by graded eSiGe films are strongly dependent on peak Ge concentration and much less dependent on Ge concentration at the surface of the eSiGe film.

FIG. 5a shows a scatter plot of pFET on current (Ion) versus off current (Ioff) currents with respect to graded eSiGe processing methods 502 and ungraded eSiGe processing methods 504. These measurements were made with the drain of the device biased at 1 V. Since fast digital logic requires a high current drive on the one hand, but low leakage current on the other hand, a higher Ion current and a lower Ioff current signifies a better performing device. Consequently, the better performing devices will have scatter points to the lower right hand portion of the graph. As such, experimental results show that the shown embodiment graded eSiGe process performs better than a similar, but ungraded eSiGe process. Other embodiments of the present invention, however, may produce on current (Ion) and off current (Ioff) currents different from the specific embodiment described herein.

Figure 5B:
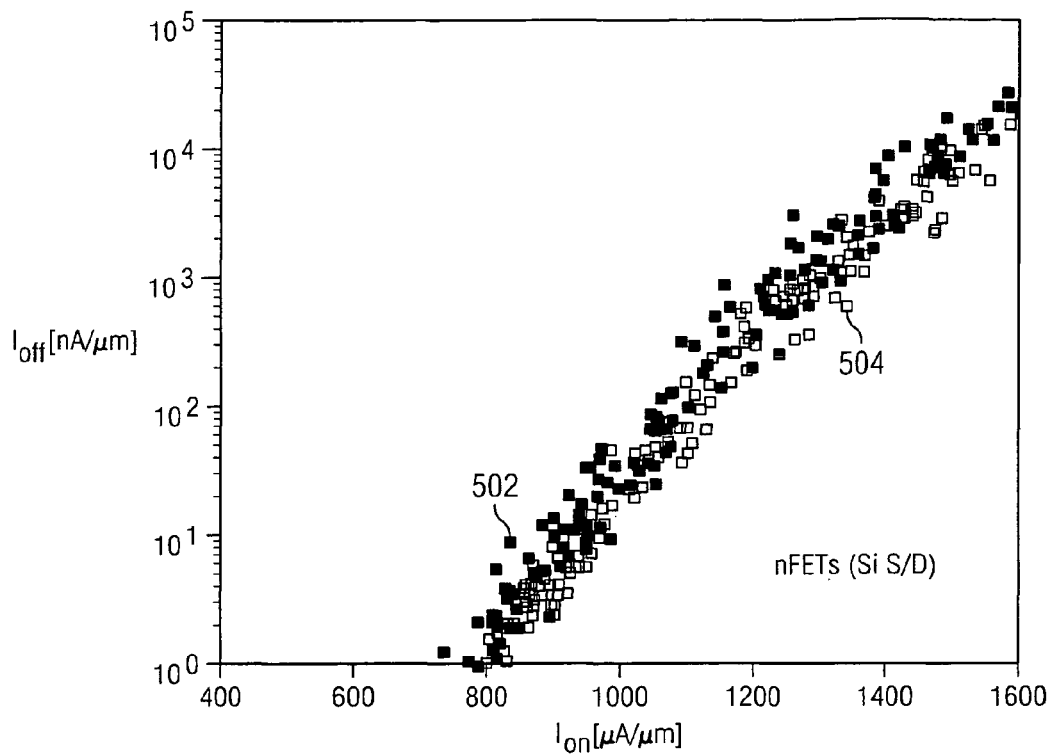

FIG. 5b shows a scatter plot of nFET on current (Ion) versus off current (Ioff) currents with respect to graded eSiGe processing methods 502 and ungraded eSiGe processing methods 504. These measurements were made with the drain of the device biased at 1 V. Since the eSiGe processing methods were applied only to pFET devices not used for the nFET devices contained on the same semiconductor body, no improvement nor degradation is seen for the nFET on current (Ion) versus off current (Ioff) currents characteristics. In other embodiments, however, performance differences may be seen between nFETs that utilize a graded eSiGe process.

Figure 6A:
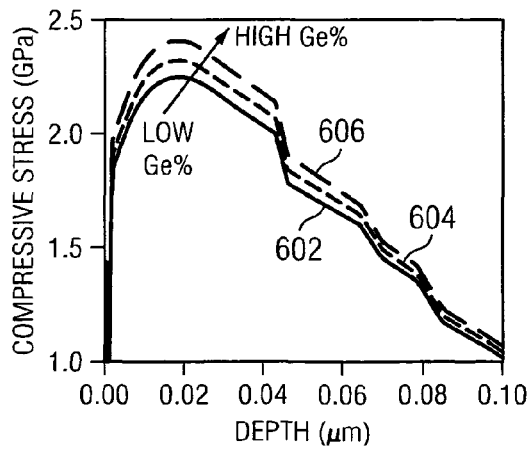
FIGS. 6a-6b are graphs depicting compressive stress as a function of depth.

FIG. 6a shows a graph of Ge peak concentration dependence of channel stress for graded SiGe devices derived from 2D TSuprem-4 simulations. The y-axis signifies channel stress, and the x-axis represents depth from the surface of the channel region. Curves 602, 604, and 606 represent different Ge concentrations, where curve 602 has the lowest level Ge concentration and curve 606 has the highest Ge concentration. In these embodiments of the present invention, a higher Ge concentration yields a higher channel stress.

Figure 6B:
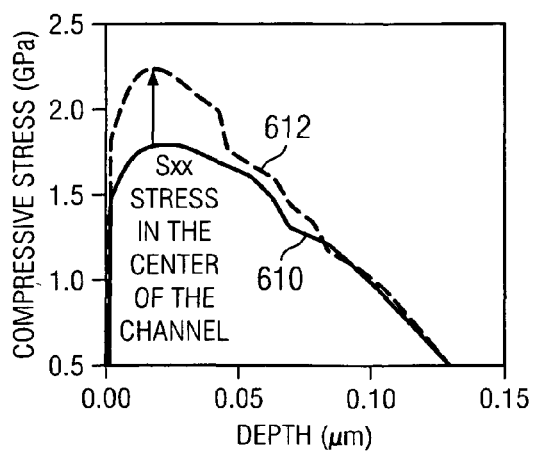

FIG. 6b shows a graph of measured stress in the source/drain region for a graded eSiGe process 612, and an ungraded eSiGe process 610. The graded eSiGe process 612 shows a higher level of stress than in the ungraded eSiGe process 610 up to a depth of over 0.5 microns. In other embodiments of the present invention, however, the stress depths and level of improvement between graded and non-graded eSiGe processes may differ from the results and improvements shown herein.

Figure 7:
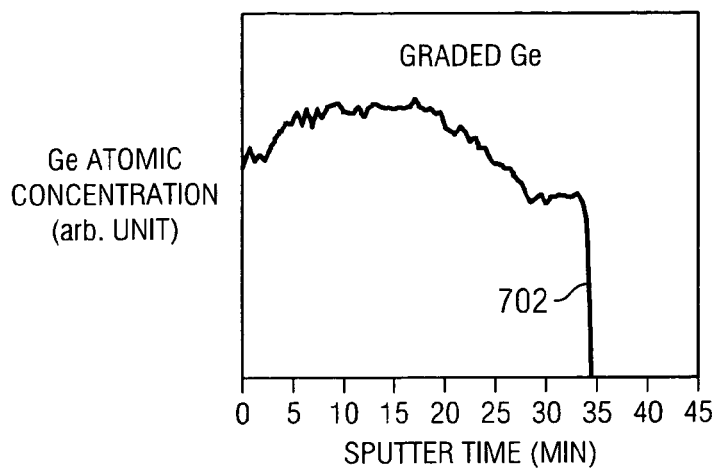
FIG. 7 is a graph depicting relative Ge concentration versus sputter time.

A Ge profile 702 of a graded eSiGe source/drain region is shown in FIG. 7, which shows the change in relative Ge concentration as a function of sputter time. This Ge profile 702 was measured using Auger Electron Spectroscopy (AES). Ge profiles of other embodiments of the present invention may vary from the results shown herein.

Figure 8A:
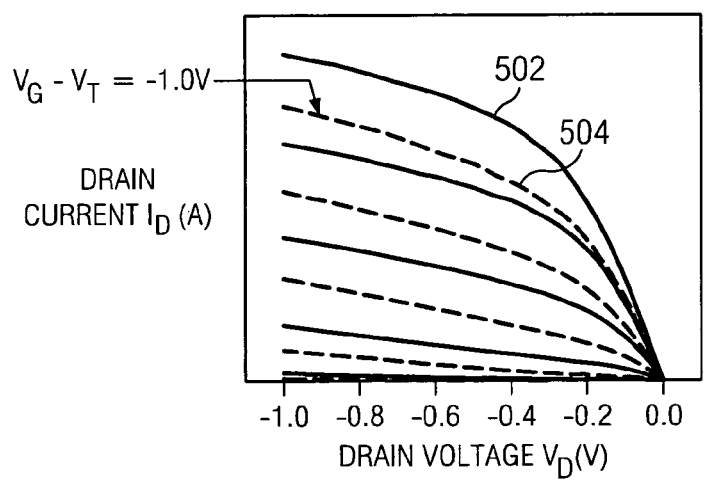
FIGS. 8a-8b are graphs depicting DC characteristics of the fabricated semiconductor device.

FIG. 8a shows a graph of drain current versus drain voltage for a graded eSiGe process 502 and an ungraded eSiGe process 504. The graded eSiGe process 502 shows an 18.5% improvement in drain current over an ungraded SiGe process at a gate overdrive voltage ($V_G$-$V_T$) of 1 V. In other embodiments of the present invention, however, the level of improvement in drain currents between graded and non-graded eSiGe processes may differ from the results shown herein.

Figure 8B:
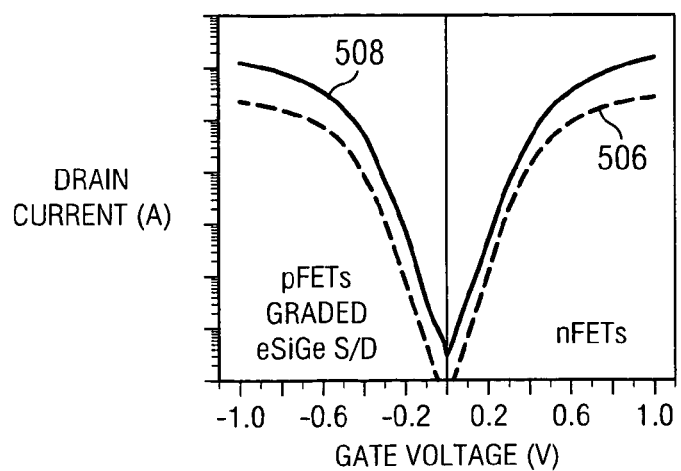

FIG. 8b shows a graph of drain current versus gate voltage for a pFETs with a graded eSiGe process and nFETs on the same semiconductor body. Measurements were made at a drain voltage of 0.5V (curve 506) and at a drain voltage of 1 V (curve 508). The curves on the right hand side of the graph designate nFET device performance and the curves on the left hand side of the graph designate pFET device performance. In other embodiments of the present invention, however, the drain current versus gate voltage characteristic processes may differ from the results shown herein.

Figure 9A:
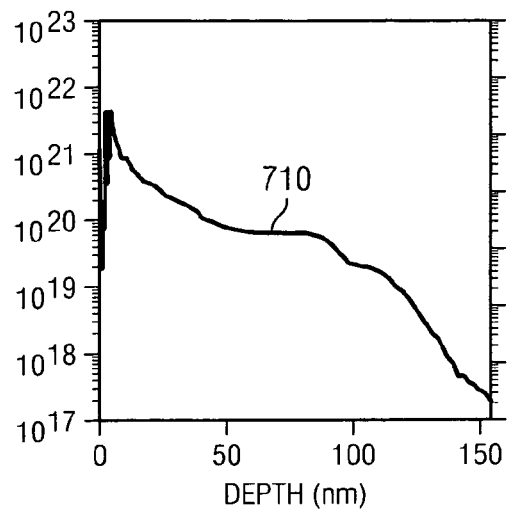
FIGS. 9a-9b show boron concentration as a function of depth in the eSiGe source/drain region.
Figure 9B:
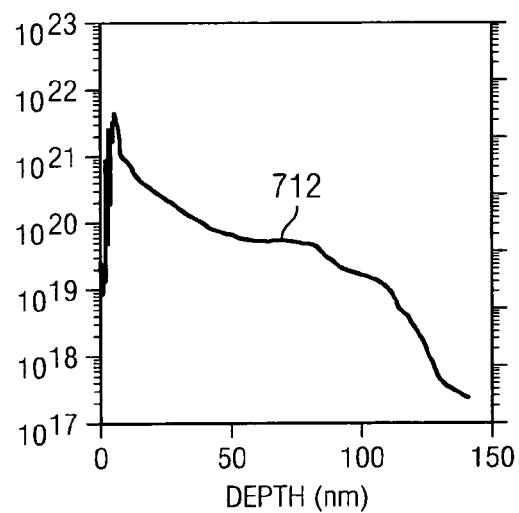

FIGS. 9a-9b show the boron depth profile of SIMS data showing substantially difference in the boron concentration between the an ungraded eSiGe implementation 710 (FIG. 9a) and a graded eSiGe implementation 712 (FIG. 9b). The y-axis is boron concentration and the x-axis is depth. The graphs show that dopant concentration in the eSiGe source/drain regions are unaffected by the Ge concentration profile.

Figure 10A:
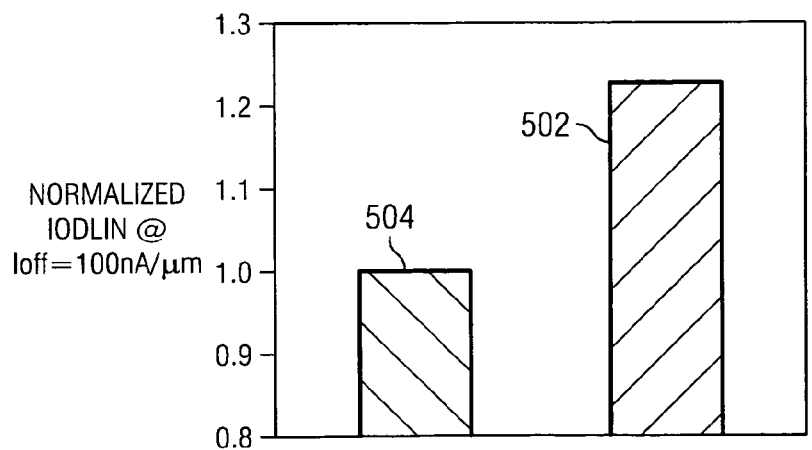
FIGS. 10a-10d are summary comparison graphs which compare the performance of a graded eSiGe process with an ungraded eSiGe process.

FIGS. 10a-10d provide a graphical summary comparisons between a ungraded eSiGe process and a graded SiGe process. In FIG. 10a, a normalized Iodlin plot compares normalized Iodlin for the ungraded eSiGe process 504 with the graded eSiGe process 502. The graph indicates that mobility enhancement is a major component of Ion improvement.

Figure 10B:
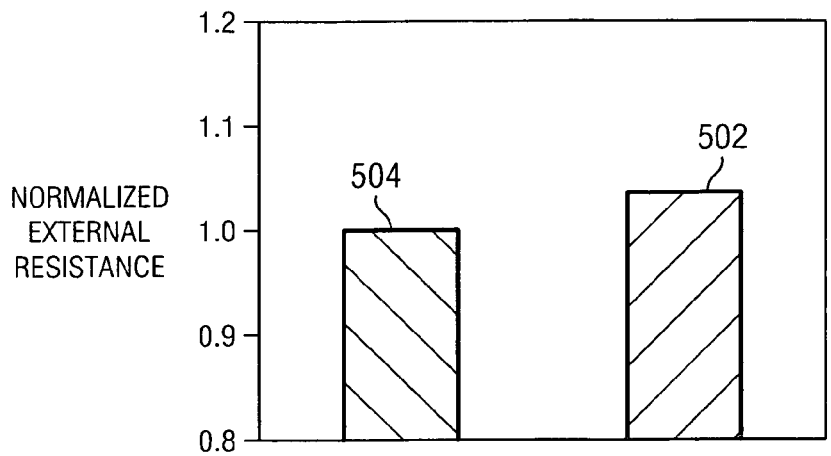

In FIG. 10b, a normalized external resistance plot compares normalized external resistance for the ungraded eSiGe process 504 with the graded eSiGe process 502. These comparable values show that the major contribution to the drive current improvement was due to mobility enhancement rather than differences in external resistance.

Figure 10C:
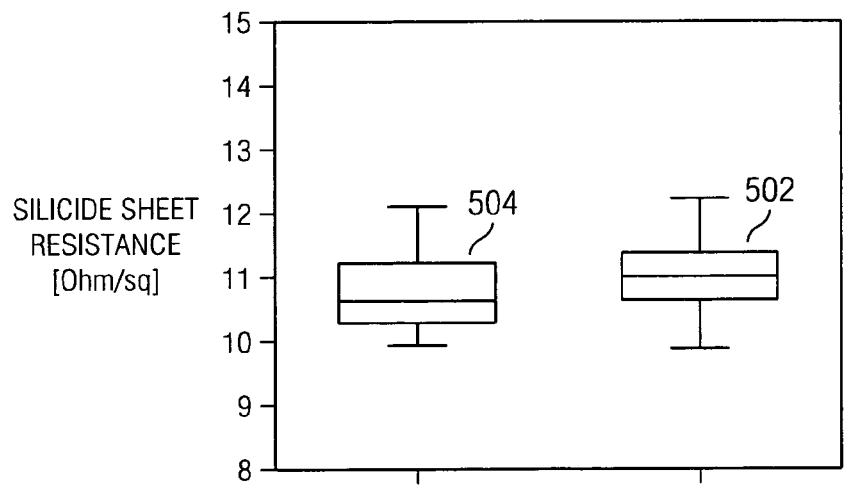

In FIG. 10c, a silicide sheet resistance plot compares silicide sheet resistance for the ungraded eSiGe process 504 with silicide sheet resistance for the graded eSiGe process 502. These comparable values show that there is little difference in the sheet resistance of the silicided portions of the eSiGe source drain regions 102 (FIG. 1) for the graded and ungraded SiGe processes.

Figure 10D:
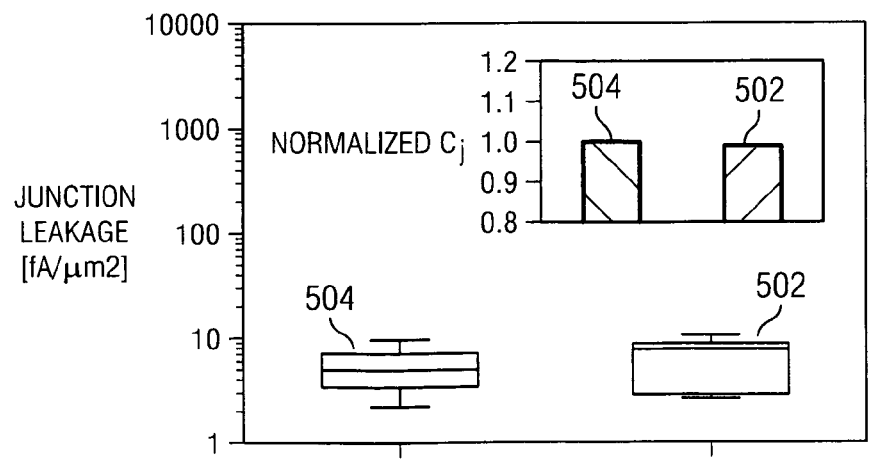

In FIG. 10d, a comparison of junction leakage and junction capacitance is shown between the ungraded eSiGe process 504 and the graded eSiGe process 502. The main graph shows the range of experimental junction leakage measurements, and the inset graph compares normalized junction capacitance. This similarity in junction characteristics can be attributed to the similarity in boron profiles shown in FIGS. 9a-9b.

Although the present invention and its advantages have been described in detail, it should be understood that various changes, substitutions and alterations can be made herein without departing from the spirit and scope of the invention as defined by the appended claims. For example, the graded SiGe techniques can be combined with other stress techniques. For example, the CESL 220 (FIG. 2f) can include stress, or additional liners may be employed. Further, the Si region 106 can be formed on a SiGe or SiC layer, thereby inducing stress from beneath.

In the preferred embodiments disclosed above, the device has been described in the context of a SiGe region embedded in a Si layer. In other embodiments, other materials can be used. For example, SiC can be embedded in the Si to create desirable stress for n-channel transistors. This can be done in combination with the embodiments described herein or in alternative thereto.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor body comprising a first semiconductor material; and
a compound semiconductor region embedded in the semiconductor body such that a side portion of the compound semiconductor region abuts a side portion of the semiconductor body, the compound semiconductor region including the first semiconductor material and a second semiconductor material, wherein the compound semiconductor region has an upper surface that extends beyond the upper surface of the semiconductor body, wherein the compound semiconductor region has a concentration of the second semiconductor material that varies along an interface between the side portion of the compound semiconductor region and the side portion of the semiconductor body, wherein the variation along the interface comprises a lower first region adjacent the interface, a second region disposed on the first region, and a third region disposed on the second region, wherein the concentration of the second semiconductor material in the first region increases about linearly from a first concentration to a second concentration, wherein the concentration of the second semiconductor material in the third region decreases about linearly from the second concentration to a third concentration, and wherein the concentration of the second semiconductor material has a peak value adjacent an upper surface of the semiconductor body.

2. The structure of claim 1, wherein the first semiconductor material comprises silicon and the second semiconductor material comprises germanium.

3. The structure of claim 1, wherein the concentration of the second semiconductor material in the second region is about constant around the second concentration, and wherein the second concentration of the second semiconductor material in the second region has a peak value of between about 24% and about 36%.

4. The structure of claim 1, further comprising a fourth region disposed under the first region, wherein the concentration of the second semiconductor material in the fourth region is about the first concentration, wherein a bottom portion of the compound semiconductor region abuts the semiconductor body along a lateral surface that is spaced from the upper surface of the compound semiconductor region, and wherein the first concentration in the first region is lower than the third concentration.

5. A method of making a semiconductor device, the method comprising:
providing a semiconductor body including an upper surface, the semiconductor body comprising a first material;
forming a gate region over the upper surface of the semiconductor body;
creating a recess in the upper surface of the semiconductor body adjacent the gate region; and
forming a compound semiconductor in the recess, the compound semiconductor comprising a crystalline mixture of the first material and a second material with a different lattice spacing than a lattice spacing of the first material, wherein forming the compound semiconductor comprises:
epitaxially depositing a first layer, wherein the concentration of the second material in the first layer increases from a first concentration at a lower surface to a second concentration at an upper surface;
depositing a second layer on the first layer, the second layer being epitaxially aligned to the upper surface of the first layer, wherein the concentration of the second material in the second layer is about the second concentration; and
epitaxially depositing a third layer on the second layer, wherein the concentration of the second material in the third layer decreases from the second concentration at a lower surface to a third concentration at an upper surface.

6. The method of claim 5, wherein forming the compound semiconductor comprises in situ doping the compound semiconductor.

7. The method of claim 5, wherein depositing the first, the second, and the third regions comprises growing silicon germanium.

8. The method of claim 7, wherein growing the silicon germanium comprises selectively growing silicon germanium in the recess.

9. The method of claim 7, wherein growing the silicon germanium comprises:
exposing the semiconductor body to silicon and germanium source gases; and
varying a flow rate of the germanium source gas so as to vary the concentration of germanium as a function of the depth of the compound semiconductor within an active area.

10. The method of claim 9, wherein the silicon source gas comprises $SiH_4$ and wherein the germanium source gas comprises $GeH_4$.

11. The method of claim 9, wherein exposing the semiconductor body to the silicon and germanium source gases further comprises exposing the semiconductor body to HCl.

12. The method of claim 9, wherein exposing the semiconductor body to the silicon and germanium source gases further comprises exposing the semiconductor body to a dopant gas.

13. The method of claim 12, wherein the dopant gas comprises $B_2H_6$.

14. A method of forming a transistor device, the method comprising:
providing a semiconductor body including an upper surface, the semiconductor body comprising a first semiconductor material;
forming a gate region over the upper surface of the semiconductor body;
creating a recess in the upper surface of the semiconductor body adjacent the gate region; and
filling the recess with a compound semiconductor by exposing the semiconductor body to a first source gas for the first semiconductor material and a second source gas for a second semiconductor material, wherein flow rates for at least one of the first and/or second source gases are varied over time such that the compound semiconductor has a graded concentration of the second semiconductor material, and wherein filling the recess with the compound semiconductor comprises:
exposing the semiconductor body to the second source gas with a first flow rate of less than 50 sccm;
after exposing the semiconductor body to the second source gas with the first flow rate, ramping up the flow rate to a second flow rate between 50 sccm and 100 sccm;
after ramping up the flow rate from the first flow rate to the second flow rate, holding the second flow rate constant for a period of time; and
after holding the second flow rate constant, ramping down the flow rate to a third flow rate.

15. The method of claim 14, wherein filling the recess with the compound semiconductor comprises forming a compound semiconductor having a concentration of the second semiconductor material that ranges from about 18%-22% near a bottom portion to a peak concentration of between about 24%-36%.

16. The method of claim 14, wherein the first semiconductor material comprises silicon and the second semiconductor material comprises germanium.

17. The method of claim 16, wherein the first source gas for the first semiconductor material comprises $SiH_4$ and the second source gas for the second semiconductor material comprises $GeH_4$.

* * * * *